(12) United States Patent
Chen

(10) Patent No.: US 7,636,014 B1
(45) Date of Patent: Dec. 22, 2009

(54) DIGITALLY PROGRAMMABLE TRANSCONDUCTANCE AMPLIFIER AND MIXED-SIGNAL CIRCUIT USING THE SAME

(75) Inventor: Hung-Chang Chen, Changhua County (TW)

(73) Assignee: Holtek Semiconductor Inc., Hsinchu (TW)

( * ) Notice: Subject to any disclaimer, the term of this patent is extended or adjusted under 35 U.S.C. 154(b) by 0 days.

(21) Appl. No.: 12/185,880

(22) Filed: Aug. 5, 2008

(30) Foreign Application Priority Data

Jul. 4, 2008 (TW) ............................. 97125175 A

(51) Int. Cl.
*H03F 3/45* (2006.01)
(52) U.S. Cl. ..................... 330/254; 330/288; 330/296
(58) Field of Classification Search ................ 330/254, 330/288, 296
See application file for complete search history.

(56) References Cited

U.S. PATENT DOCUMENTS

| | | | |
|---|---|---|---|
| 6,456,158 B1 | 9/2002 | Giuroiu | |
| 6,462,527 B1 | 10/2002 | Maneatis | |
| 6,466,100 B2 | 10/2002 | Mullgrav, Jr. et al. | |
| 6,509,796 B2 * | 1/2003 | Nguyen et al. | ............... 330/254 |
| 7,061,309 B2 * | 6/2006 | Kato et al. | ................... 327/553 |
| 7,504,874 B2 * | 3/2009 | Oehm | ......................... 327/513 |
| 2002/0180512 A1 * | 12/2002 | Papathanasiou | ............. 327/530 |
| 2008/0100373 A1 * | 5/2008 | Terryn et al. | ................. 327/552 |

* cited by examiner

*Primary Examiner*—Patricia Nguyen
(74) *Attorney, Agent, or Firm*—WPAT, PC; Justin King

(57) ABSTRACT

The present invention relates to an trans-conductance amplifier, cooperating with a digital programmable current mirrors, can be applied to digital programmable current-mode integrated circuits, voltage control oscillators, adaptive frequency adjust mechanism, adaptive continuous analog filters via the corresponding trans-conductance adaptation controlled by the digital control signals. The present invention disclosed a digital programmable current mirror suitable for the second stage of the trans-conductance amplifier so as to reform the fixed gain trans-conductance amplifier to be digitally programmable.

12 Claims, 8 Drawing Sheets

DIGITALLY PROGRAMMABLE TRANSCONDUCTANCE AMPLIFIER AND MIXED-SIGNAL CIRCUIT USING THE SAME

BACKGROUND OF THE INVENTION

1. Field of the Invention

The present invention relates to a trans-conductance amplifier, and more particularly to, a digitally programmable trans-conductance amplifier and mixed signal circuits using the same.

2. Description of the Prior Art

The conventional current mirror for the trans-conductance amplifier is shown in FIG. 1. The programmable current mirror disclosed in the prior art is programmed by changing the width of the parallel transistors at the output stage of the current mirror so as to change the output current. However, said programmable current mirror, if being applied to the output stage, cannot address some issues such as gain, bandwidth, stabilities, because the output current size change will have direct effect on its output impedance and the same is an important variable related to bandwidth and stabilities.

As suggested in U.S. Pat. Nos. 6,466,100 B2 and 6,462,527 B1, in both of the prior arts digitally control signals are used to control and switch the counting of parallel transistors so as to change the equivalent widths of the transistors and a variable current source is used to provide the bias current of the output stage. The drawbacks of these two prior arts are that the variation of the bias current of the output stage according to the control signal is significant and thus their output impedance varies significantly.

Also, in U.S. Pat. No. 6,456,158 B1 suggested a trans-conductance amplifier, which is digitally programmable, however, a plurality of resistors invite noises and at output stage, inevitably, there needs a current follower to enhance the output stage to be high impedance.

Hence, the present invention provides a solution for a trans-conductance amplifier, particularly a digitally programmable trans-conductance amplifier, to address the issue of the conventional programmable current mirrors. The present invention is assumed that the output current is a constant and the switch can be turned on or off to change the reference current and the widths of the transistors so as to achieve the goal for programmable current mirrors. The disclosures of the present invention suggest reforming all current mirrors to be programmable and suitable for the second stage of the trans-conductance amplifier which reforms the trans-conductance amplifier with fixed gain to be of variable trans-conductance so as to let the mixed mode signal circuit using the same with variable gain can base on the feedback loop to achieve the goal of setting the corresponding parameters to be constant.

SUMMARY OF THE INVENTION

In view of the disadvantages of prior art, the primary object of the present invention relates a digitally programmable trans-conductance amplifier using digitally programmable active current mirror so as to achieve high and constant impedance and at the same time achieve precise trans-conductance.

Preferably, said digitally programmable trans-conductance amplifier comprises: an active current mirror circuit, said active current mirror circuit comprises: a reference system and a variable current source for providing the bias current in the reference system; an output side current mirror and a constant current source for providing the bias current at the output side; a plurality of switches; a first node and a second node, said first node and said second note are disposed at the intersection between said reference system and the variable current source for providing the bias current in the reference system, and at the intersection between said active current mirror and the fixed current source at output side respectively; and a constant trans-conductance amplifier, wherein the output of said amplifier is interconnected with said first node.

Preferably, as illustrated in FIG. 2, the trans-conductance value of said digitally programmable amplifier can be expressed as the equation at the follows:

$$I_{OUT} = V_{IN} \times G_m \times \frac{1}{g_{m1}} \times g_{m2}$$

$$I_{OUT} = V_{IN} \times G_m \times \frac{W_2}{W_1}$$

The hypothesis for the above formula is, $V_{GS1}$ and $V_{GS2}$ are the same and to be a constant value. Preferably, the output DC bias current is a constant current. To achieve the goal, the current source $I_{VAR}$ has to be changed according to the width variation of a transistor 211 so as to keep $V_{GS1}$ constant, and then $V_{GS1}$ and $V_{GS2}$ are identical to each other. If the current source $I_{VAR}$ follows the change of the width of the transistor $M_1$, we need a corresponding variable current source and further need a plurality of switches to control the width of the transistor $M_1$.

The present invention relates to using a variable current source and transistor array switches to control the effective widths of the transistors at reference side. And by changing the trans-conductance value at the reference side of the transistors the current gain of the current mirror can be further varied, and the current gain is according to the change of the trans-conductance of the whole circuitry.

As illustrated in FIG. 2, in the current mirror there are two current sources respectively at reference side and output side. In the present invention we assigned the current source at reference side to be variable one and the current source at the output side to be a constant one. And the amplification of the current mirror in the current mode is determined by the current ratio between the output and the input. Hence, as long as the current ratio is changed then the amplification rate is also changed so as to achieve the goal of changing the trans-conductance value on the whole circuit.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become readily understood from the detailed description given herein below and the accompanying drawings which are given by way of illustration only, and thus are not limitative of the present invention and wherein.

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described. For your esteemed members of reviewing committee to further understand and recognize the fulfilled functions and structural characteristics of the invention, several exemplary embodiments cooperating with detailed description are presented as follows.

Figure 1:
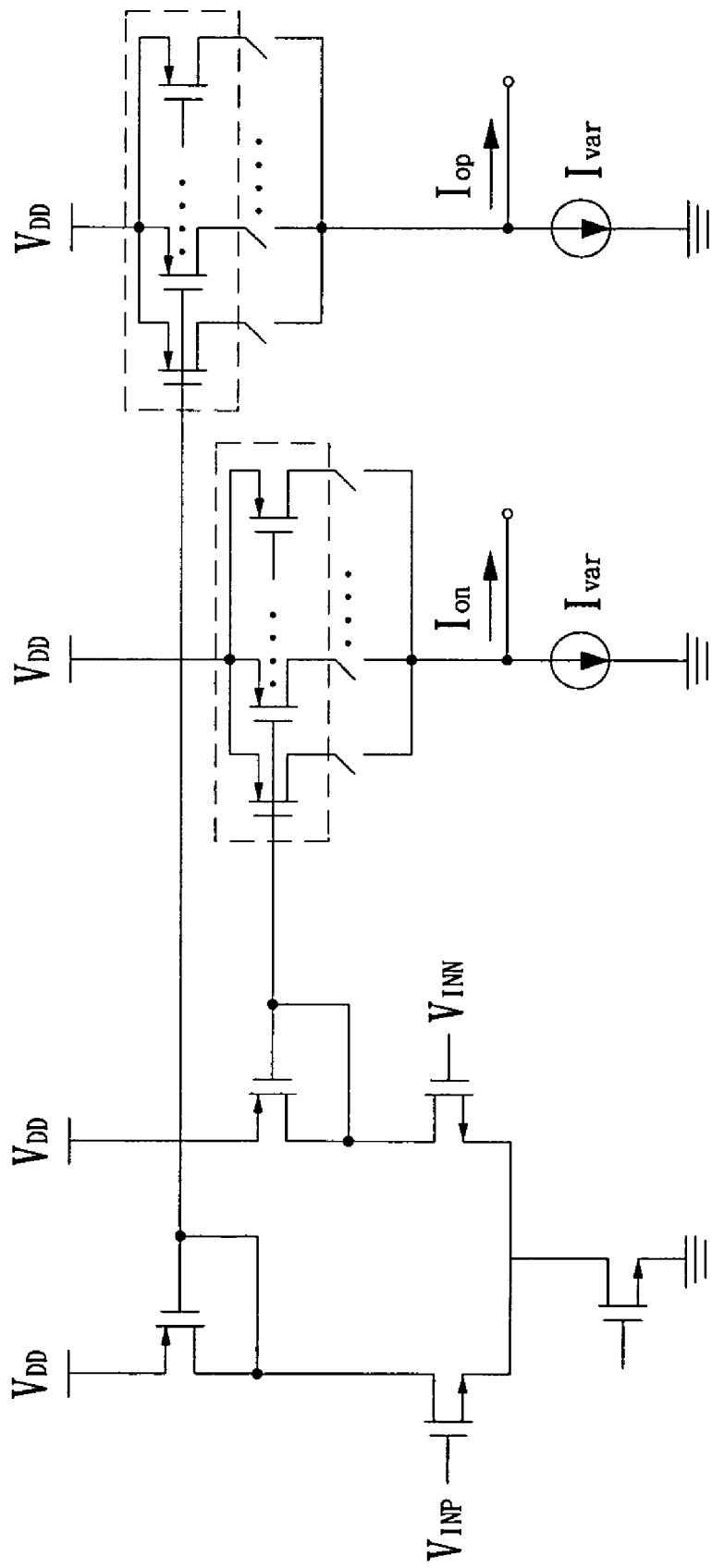
FIG. 1 relates to a diagram of the prior arts according to the present invention.
Figure 2:
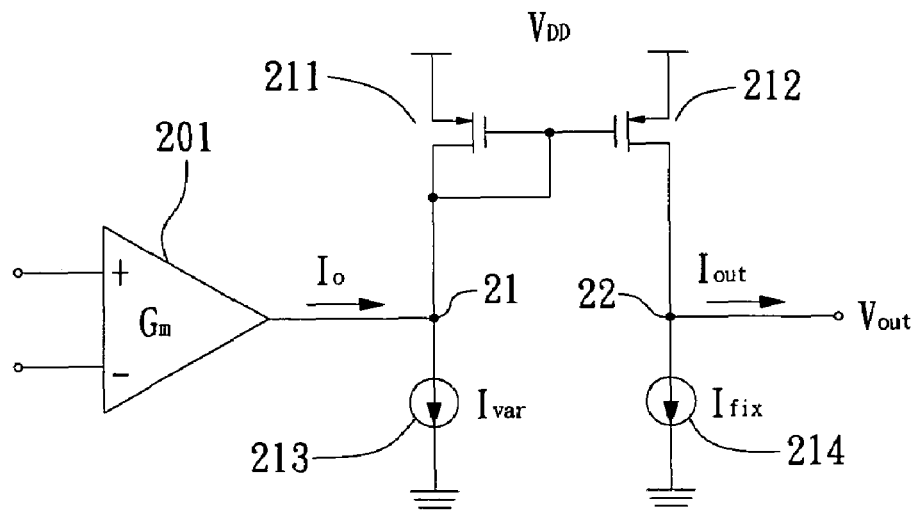
FIG. 2 relates to a diagram of a preferred embodiment according to the present invention.
Figure 3:
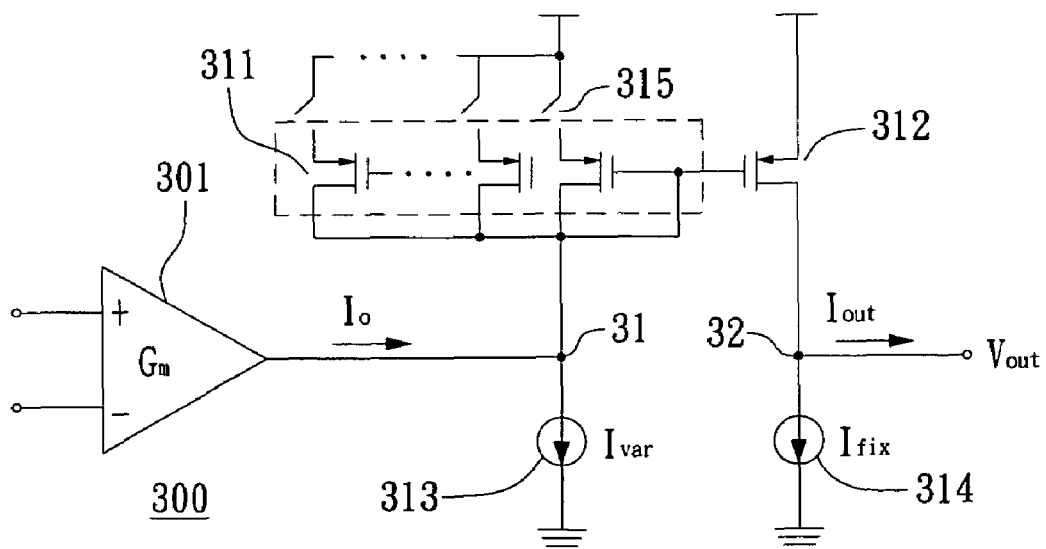
FIG. 3 relates to yet another diagram of a preferred embodiment according to the present invention.

FIG. 3 relates to a programmable current mirror circuit and a trans-conductance amplifier according to the present invention.

Preferably, as suggested by FIG. 3, the voltage signal ($V_{IN}$) is injected to a trans-conductance amplifier 301, then a output current ($I_O$) can be obtained, and said output current ($I_O$) is equivalent to a small-signal input voltage signal ($V_{IN}$) times a trans-conductance value ($G_m$) and on the signal path for a whole amplifier circuit 300 merely input sides and output sides are high-impedance nodes. The impedance observed from node 31 is ($1/g_{m1}$), and the trans-conductance value at an active current mirror 312 is ($1/g_{m2}$), and four of them timed together to form the entire small signal output current ($I_{OUT}$). The transistor width of a reference system 311 is $W_1$, and the transistor width of an active current mirror is $W_2$, from the equation one skilled in the ordinary art can understand the entire output current is relevant to the transistor width ratio between the reference system and active current mirror. Therefore, we can change the transistor width so as to change the small signal output current, however, it is not desirable to change DC output current and impedance, as a result, what we do is to change the transistor width at the reference side.

Figure 4:
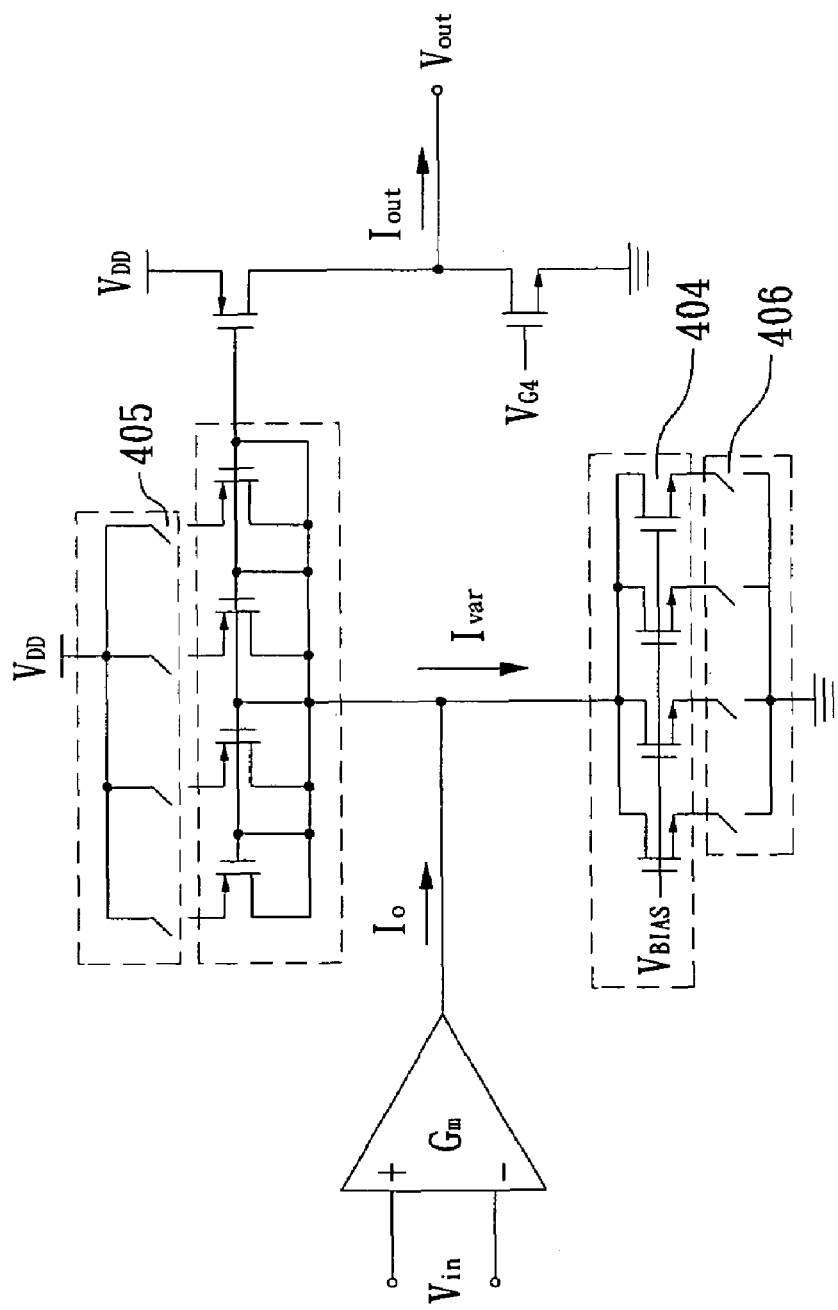
FIG. 4 relates to yet another diagram of a preferred embodiment according to the present invention.

As illustrated in FIG. 4, an exemplary circuit related to variable current source and transistor switches 405/406 is disclosed. Switches 405/406 are controlled by digital control signal to be turned on or off so as to achieve the effective widths of the reference current source and reference transistors to be variable. Wherein, for the linearity of the entire circuit, the circuitry alone the signal path should be as simple as possible. As a result we disposed transistor switches 405/406 at the source side of the reference side transistors 403/404. In FIG. 4 two sets of switch array 405/406 at top and bottom are simultaneously turning on or turning off.

Figure 5:
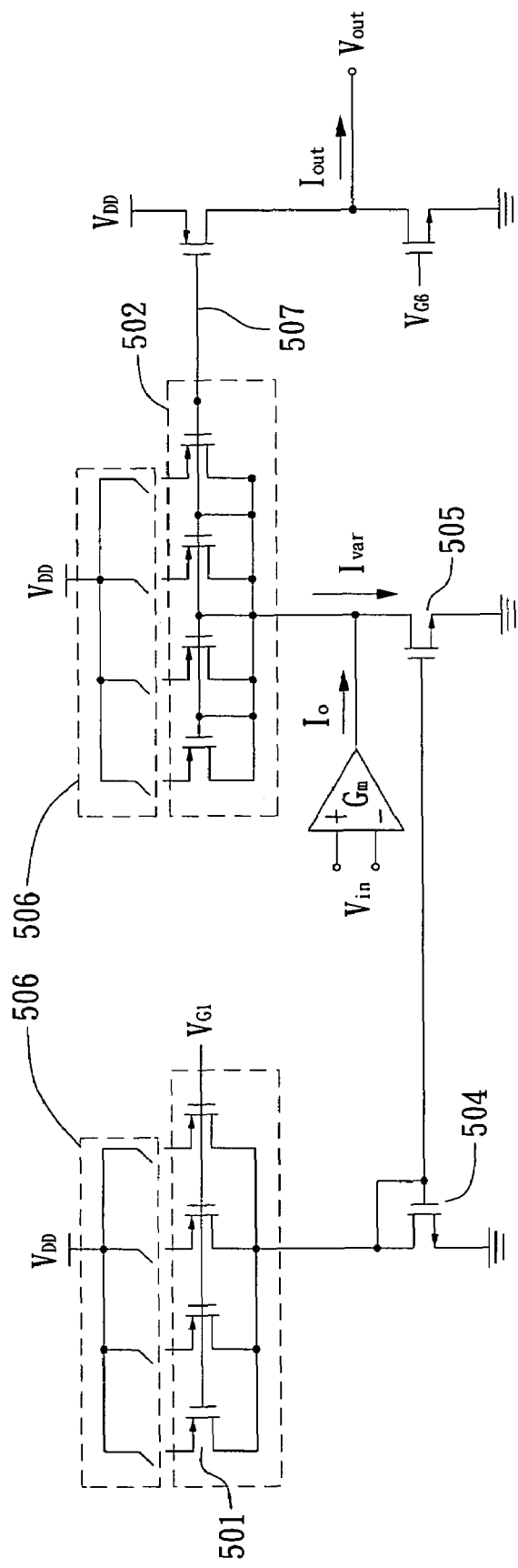
FIG. 5 relates to yet another diagram of a preferred embodiment according to the present invention.

In FIG. 5, let the voltage at node 507 and $V_{G1}$ to be the same, the variable current source provides a current to transistors 505 via transistors 504, and a switch 506, for which transistors 501 and transistors 504 can be turned on or off simultaneously so as to achieve the goal of the variable function of current source 513, and the sizes of 501/504 are determined by the ratio of 504/505. Suppose the size of said 505 is ten times of said 504, then correspondingly the size of 501 is only 10% of said 502 so as to save the consuming power of said variable current source. If we let the width variation at transistor reference side is of binary weight, the counting of transistor switch 506 is dependent on the bit number of resolution in the digitally programmable current mirror, for example, if the resolution the demanding variable current mirror is less than 10%, there will need four transistor switches and 4 control bit resolution can achieve 6.25%.

Figure 6:
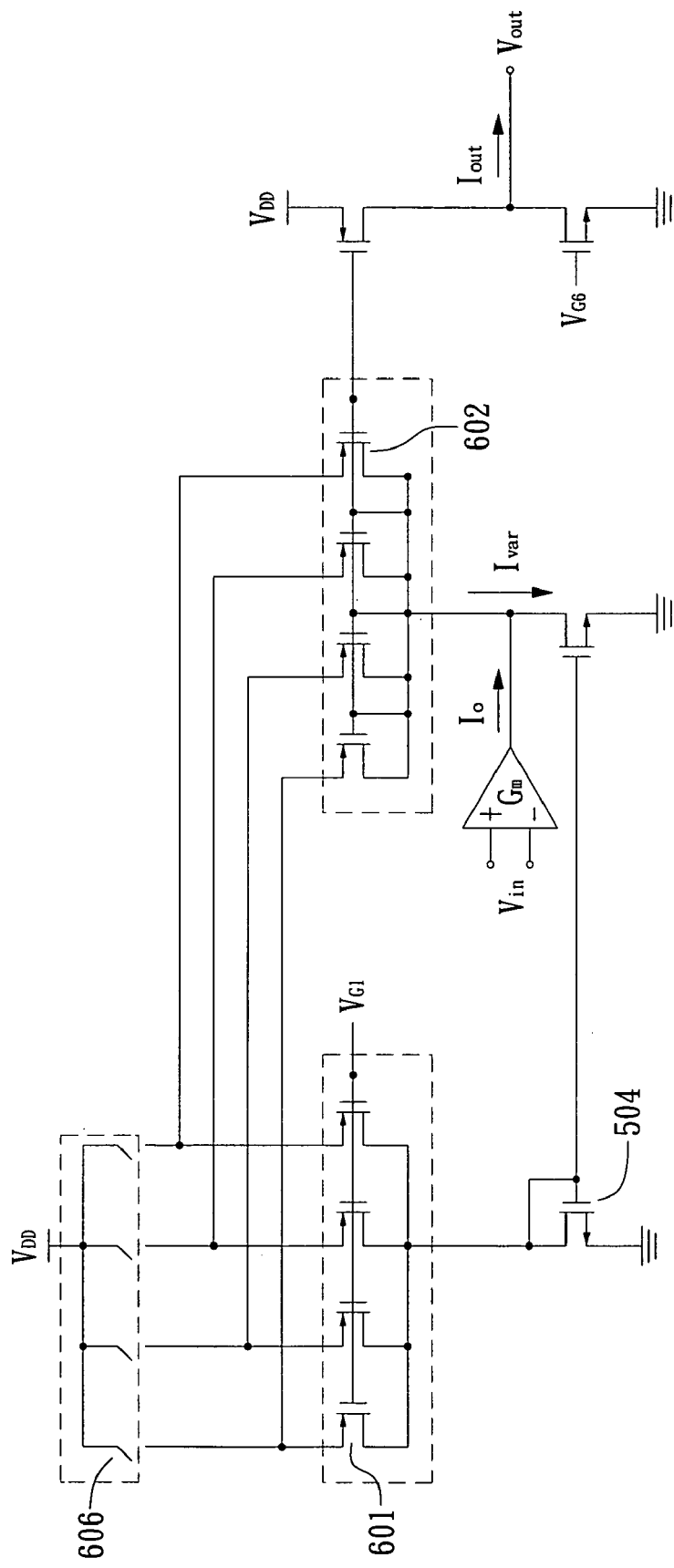
FIG. 6 relates to yet another diagram of a preferred embodiment according to the present invention.

Since the sizes for switch 506 are the same and the corresponding action is to simultaneously turn on and off the transistor switches, as a result we can use the same set of transistor switches to share 501 and 502, and the concept of sharing circuits brings the benefit of saving the die size, as illustrated in FIG. 6, the transistors 601/602 are turned on or off simultaneously, that is to say, each one of transistor switches control a pair of transistors to be turned on or off. As a result, only one set of switches 606 is being needed and the circuit can be further simplified.

Figure 7:
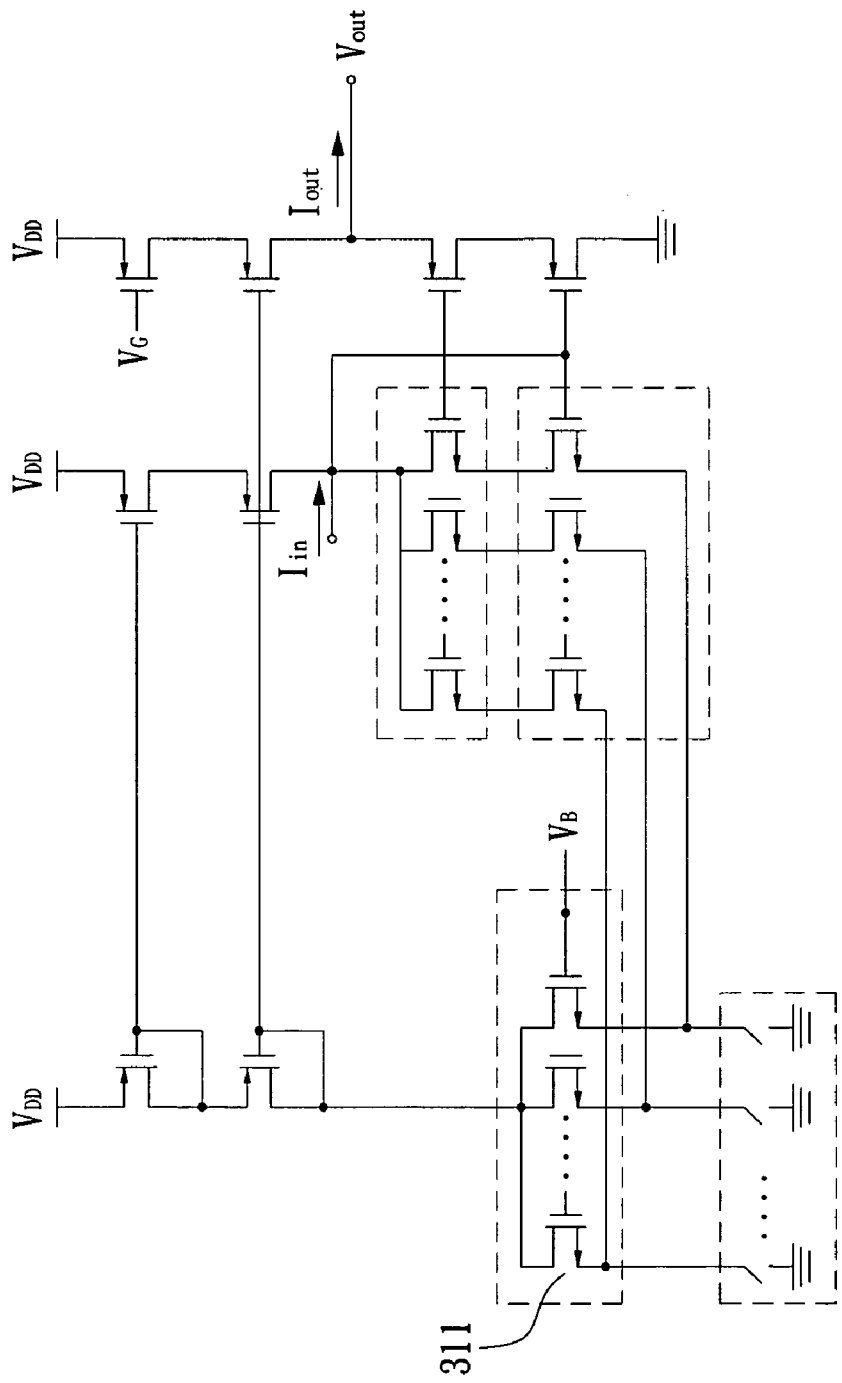
FIG. 7 relates to yet another diagram of a preferred embodiment according to the present invention.

By the advantage of the disclosures of the present invention, skilled persons can use variable reference current sources and switch arrays, accordingly all the current mirrors can be reformed to be digitally programmable current mirrors accepting the digital signal control, as illustrated in FIG. 7, the original wide-swing cascode current mirrors, after the reforming by using variable reference current sources and switch arrays, digitally programmable wide-swing cascode current mirrors are obtained. Said trans-conductance amplifier, while co-operating with the trans-conductance amplifier of fixed gain, can be reformed to be digitally programmable trans-conductance amplifier and suitable for automatic frequency adjusting mechanism. In the most applications of automatic adjusting mechanism master-and-slave control systems are adopted, and in such systems there exists a hypothesis that master filter and slave filter must match each other perfectly, then skilled persons can use the same control signal to control the center frequency and quality coefficient by the same control signal. The control signal inside the master-slave control system can be either analog voltage signal or digital voltage signal, and these two different signals lead different feedback adjust mechanism.

Figure 8:
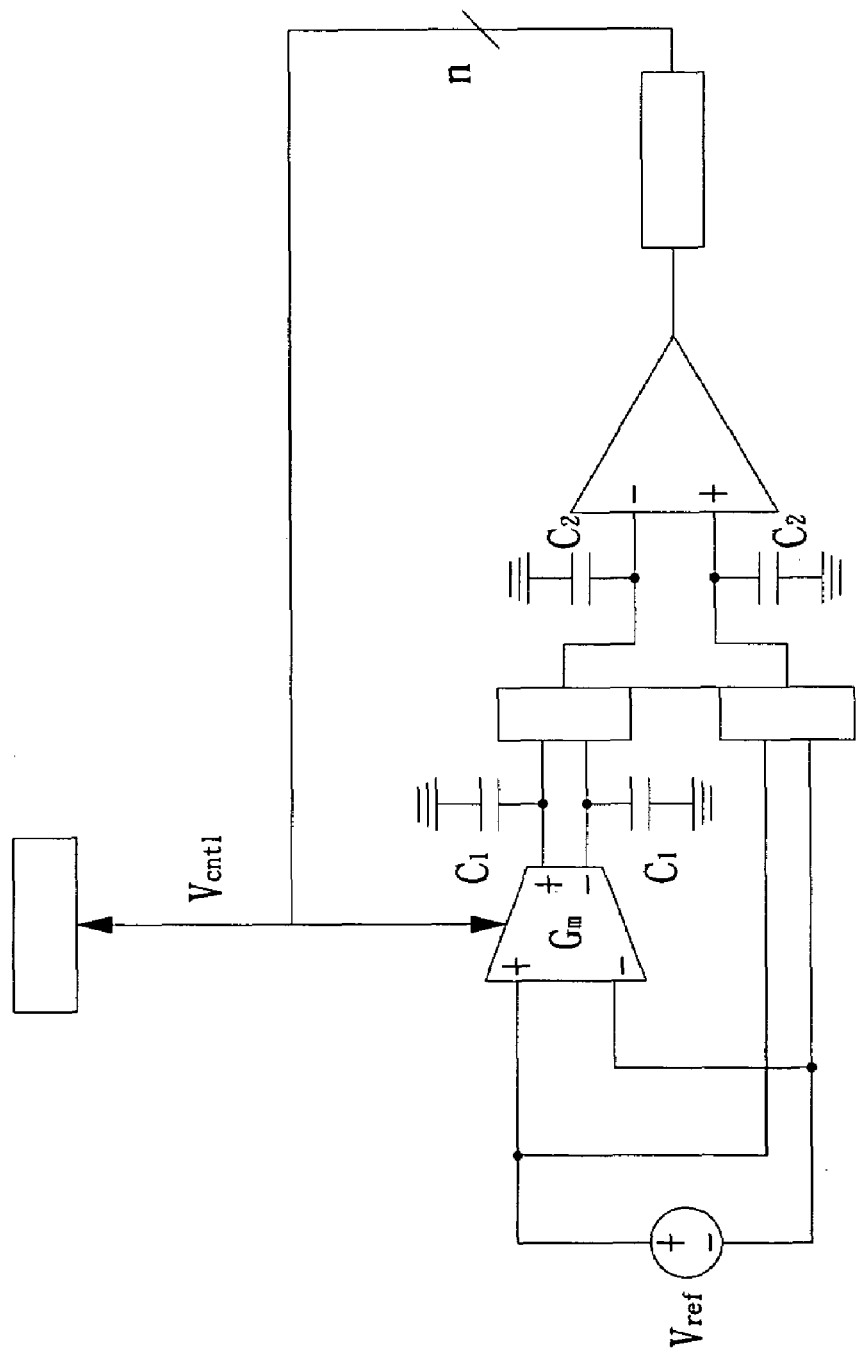
FIG. 8 relates to yet another diagram of a preferred embodiment according to the present invention applied to a mixed-mode circuit.
Figure 9:
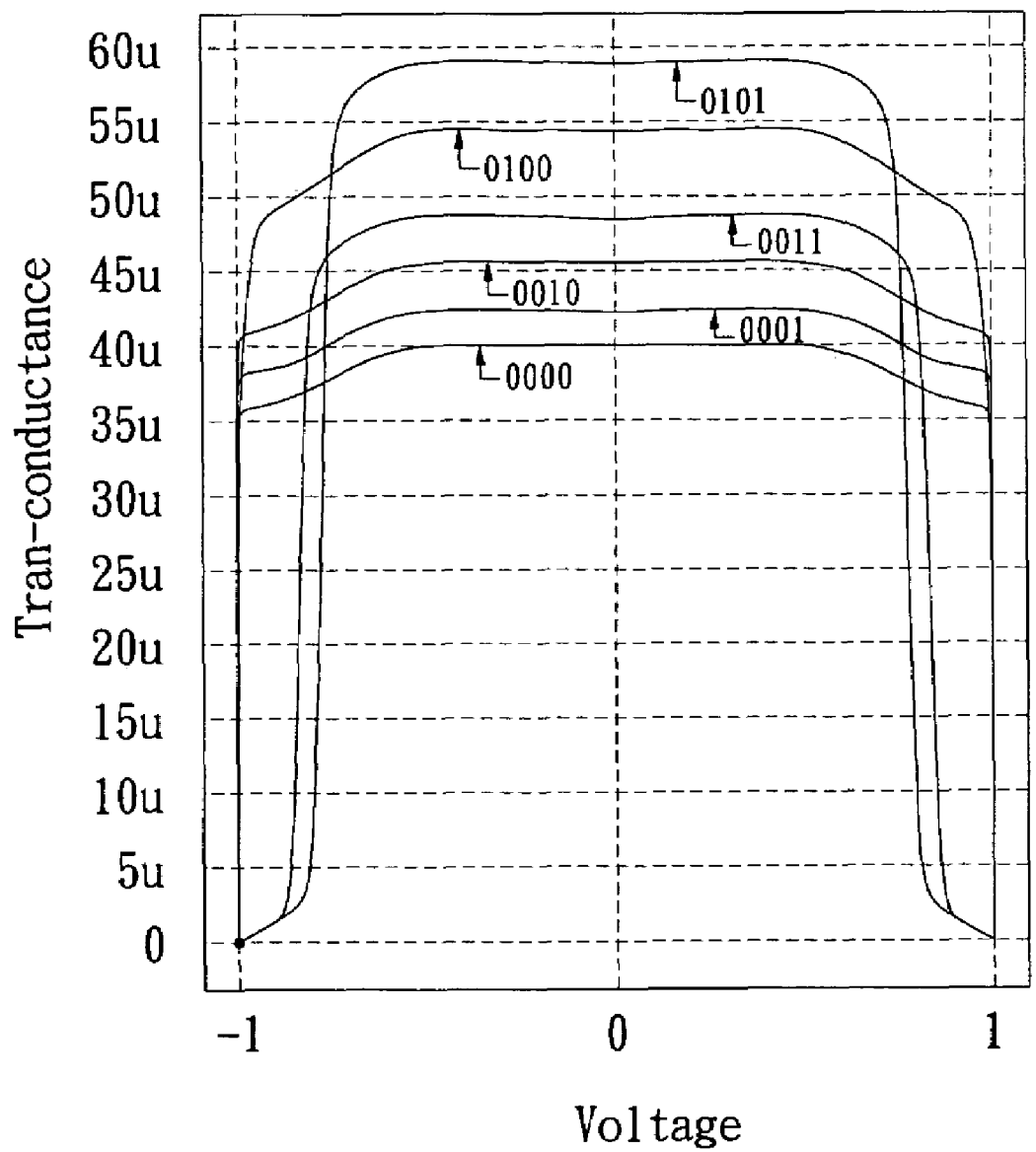
FIG. 9 relates to an exemplary schematic of the trans-conductance value over the voltage according to the present invention.

Referring to FIG. 8 now, since the control signal changes and the current mirror transfer ratio is determined by the control signal, different control signals will correspond to a voltage gains, unity-gain frequencies, and phase margins. Skilled persons can find out the unity-gain frequency will monolithically increase as digitally control signals increase, and such a result can satisfy the critical behavior of the adjusting mechanism in FIG. 8, that is, the unity frequency of slave OTA will be compared with the input signal frequency, and the slave OTA will change its unity gain frequency according to the result for the frequency comparison.

In the present invention, the digital voltage control signals are used to complete the feedback adjusting mechanism and are used for successive approximation. As illustrated by FIG. 8, skilled person can find, if the control signals are digital, then the restored digital signals in SAR can be directly applied to the trans-conductance amplifier as control signals for adjusting trans-conductance value so as to save the cost of some digital-to-analog converters (DAC). In the continuous successive approximation resistor ADC (SAR ADC) circuits, digital-to-analog converters are a very critical circuit. In case the cost of said DAC is to be omitted, the entire design complexity will be greatly reduced.

The invention being thus aforesaid, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A digitally programmable trans-conductance amplifier, comprising:
    an active current mirror circuit, said mirror circuit comprising:
        a reference system;
        a first current source for providing said reference system a bias current;
        an output side current mirror;
        a second current source for providing the bias current at the output side;
        a plurality of switches;
        a first node and a second node, said two nodes are respectfully disposed at the intersection between said reference system and said first current source and at the intersection between said output side current mirror and said second current source; and
    a constant trans-conductance amplifier, wherein the output of said amplifier is interconnected with said first node.

2. The digitally programmable trans-conductance amplifier as set forth in claim 1, wherein said second current source is a constant current source.

3. The digitally programmable trans-conductance amplifier as set forth in claim 1, wherein said first current source is a variable current source.

4. The digitally programmable trans-conductance amplifier as set forth in claim 3, wherein said variable current source is controlled by said a plurality of switches.

5. The digitally programmable trans-conductance amplifier as set forth in claim 1, wherein the trans-conductance value of said amplifier can be expressed as: the constant trans-conductance multiplied by the ratio of said second current source and said first current source.

6. The digitally programmable trans-conductance amplifier as set forth in claim 1, wherein the first current source is made of transistors.

7. The digitally programmable trans-conductance amplifier as set forth in claim 1, wherein the second current source is made of transistors.

8. The digitally programmable trans-conductance amplifier as set forth in claims 6 or 7, wherein the trans-conductance value of said amplifier can be expressed as: the constant trans-conductance multiplied by the ratio of the transistors of the second current source and the first current source.

9. The digitally programmable trans-conductance amplifier as set forth in claim 6, wherein the transistors are cascoded.

10. The digitally programmable trans-conductance amplifier as set forth in claim 7, wherein the transistors are cascoded.

11. The digitally programmable trans-conductance amplifier as set forth in claim 1, wherein the digitally programmable trans-conductance amplifier can be applied to the closed loop in a mixed signal circuit.

12. The digitally programmable trans-conductance amplifier as set forth in claim 11, wherein the mixed signal circuit is a filter.

* * * * *